US008558254B1

(12) United States Patent
Ho et al.

(10) Patent No.: US 8,558,254 B1
(45) Date of Patent: Oct. 15, 2013

(54) HIGH RELIABILITY HIGH VOLTAGE VERTICAL LED ARRAYS

(71) Applicants: Wing Yan Ho, Hong Kong (HK); Enboa Wu, Hong Kong (HK)

(72) Inventors: Wing Yan Ho, Hong Kong (HK); Enboa Wu, Hong Kong (HK)

(73) Assignee: Hong Kong Applied Science and Technology Research Institute Company Limited, Hong Kong Science Park, Shatin, New Territories, Hong Kong (CN)

( * ) Notice: Subject to any disclaimer, the term of this patent is extended or adjusted under 35 U.S.C. 154(b) by 0 days.

(21) Appl. No.: 13/688,250

(22) Filed: Nov. 29, 2012

(51) Int. Cl.
*H01L 29/18* (2006.01)

(52) U.S. Cl.
USPC ............... 257/88; 257/93; 257/E33.055

(58) Field of Classification Search
USPC ........................... 257/88, 93, E33.055
See application file for complete search history.

(56) References Cited

U.S. PATENT DOCUMENTS

| | | | |
|---|---|---|---|
| 6,410,942 B1 | 6/2002 | Thibeault et al. | |
| 6,547,249 B2 | 4/2003 | Collins et al. | |
| 7,535,028 B2 | 5/2009 | Fan et al. | |
| 7,985,970 B2 | 7/2011 | Ibbetson et al. | |
| 8,129,917 B2 * | 3/2012 | Kim et al. | 315/246 |
| 2008/0179602 A1 * | 7/2008 | Negley et al. | 257/88 |
| 2008/0230789 A1 | 9/2008 | Onushkin et al. | |
| 2009/0262527 A1 * | 10/2009 | Chou | 362/231 |
| 2012/0043563 A1 * | 2/2012 | Ibbetson et al. | 257/88 |

* cited by examiner

*Primary Examiner* — Trung Q Dang
(74) *Attorney, Agent, or Firm* — Ella Cheong Hong Kong; Sam T. Yip

(57) ABSTRACT

Improved arrays of high voltage vertical-emitting LEDs that generate substantially lower heat than conventional LED arrays are provided. In particular, the present invention provides an array of high-voltage vertical LEDs each of which includes a first electrode positioned on a light-emitting face and a second electrode. A conductive matrix surrounds each LED and electrically communicates with each of the electrodes while an electrically-insulating material is positioned between adjacent diodes such that a first electrical current path is defined between the second and first electrodes through each diode. An isolating material is positioned in the conductive matrix between adjacent LEDs to isolate the adjacent second electrodes from one another. Further positioned between adjacent diodes is a material capable of permanently lowering its resistance to provide an alternate electrical pathway following a failure of an individual LED. High reliability high voltage vertical LED arrays are thereby provided.

20 Claims, 3 Drawing Sheets

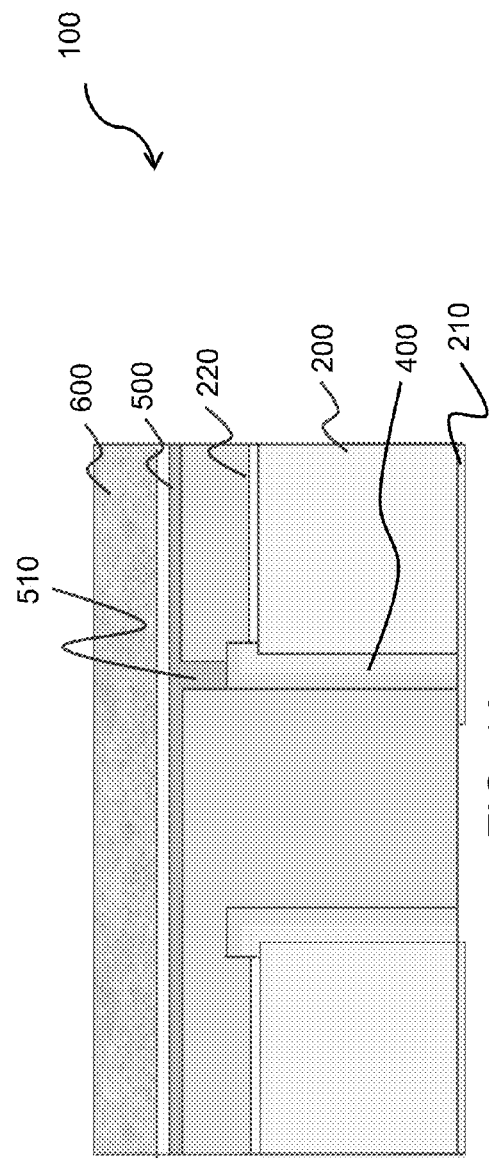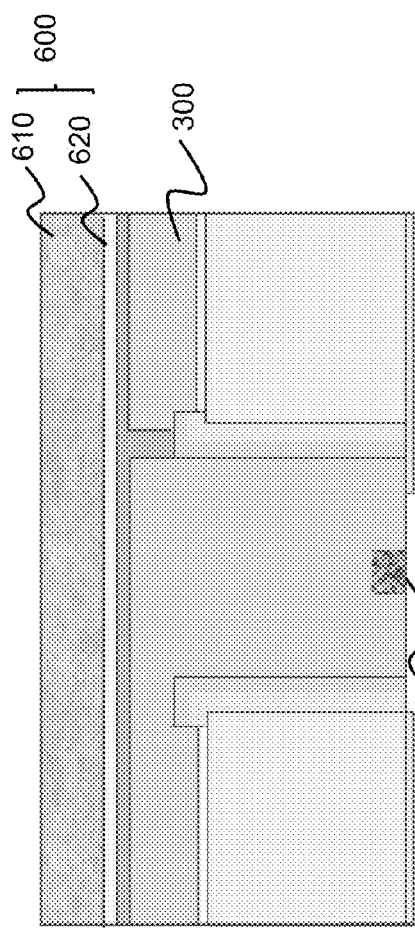

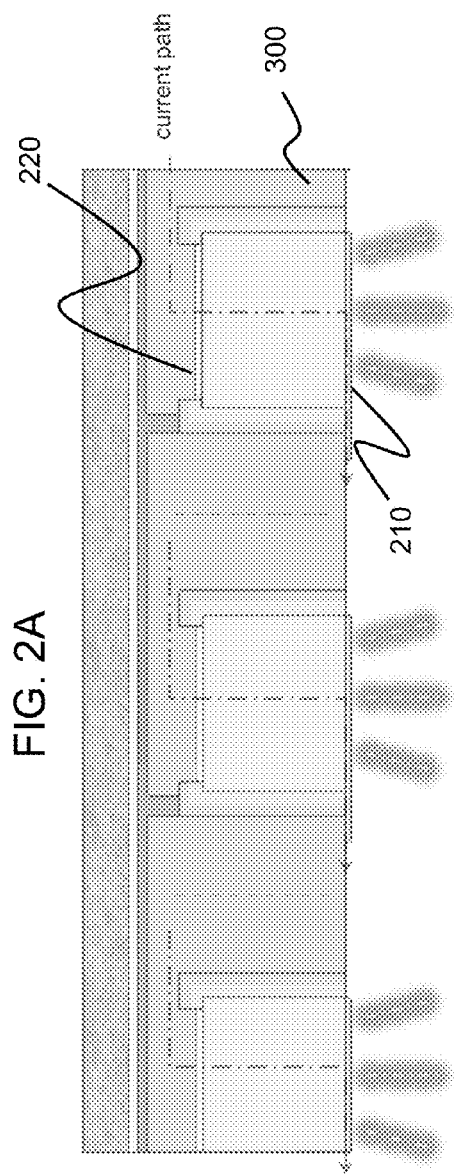
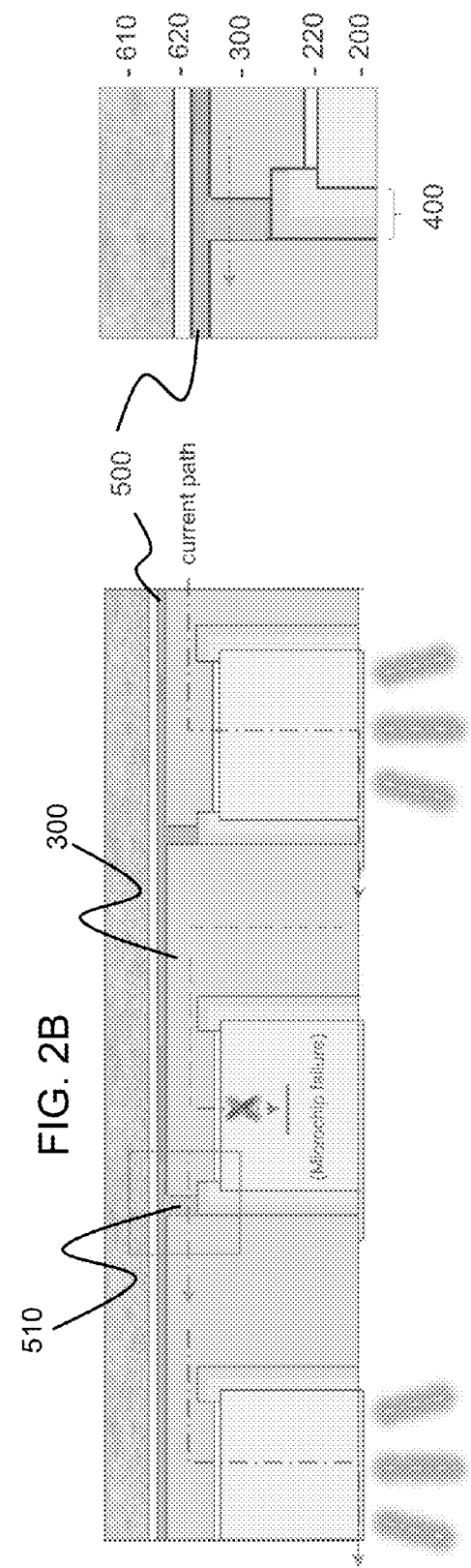
FIG. 2A
FIG. 2B in parallel circuit in series circuit

HIGH RELIABILITY HIGH VOLTAGE VERTICAL LED ARRAYS

FIELD OF THE INVENTION

The present invention relates to vertical LED arrays in general and, more particularly, to high-voltage vertical LED arrays having alternative electrical pathways in the event of a device failure to provide high reliability arrays.

BACKGROUND OF THE INVENTION

LEDs have numerous current and potential uses as light sources in various commercial applications including computer displays, residential and business interior lighting, outdoor lighting, signage, signals, and televisions. However, there are several problems with conventional LEDs. Conventional LEDs are typically packaged singly or with a small number of devices in each package. Such conventional packages usually employ low voltages with high driving currents. The higher the drive current, the more heat is generated in each LED. This requires mechanisms to dissipate the heat including heavy and expensive heat sinks or active cooling such as fans. Both mechanisms greatly increase the packaging cost and make it more difficult to use large numbers of LEDs, particularly in a small area.

More recently, LED arrays have been formed. These arrays typically use multiple horizontal-emitting LEDs that require the same high drive currents and result in the same heat dissipation problems as non-array packages. Although some vertical-emitting LED arrays have been formed, these arrays typically have complex designs that are expensive to fabricate and have low fabrication yields.

High-voltage LEDs are also known. These LEDs operate at a high voltage and thus draw substantially less current during operation. As a result, less heat is generated by these high-voltage LEDs. For example, for LEDs having output power dissipation of 1 watt, a low-voltage LED of 3V uses a 350 mA drive current; however, a high-voltage LED of 50V requires only a 20 mA drive current.

There remains a need in the art for improved LED arrays that generate low levels of heat while producing a high lumen output. There is a further need in the art for LED arrays that can achieve these features while also being extremely reliable in the event of a failure of one or more LEDs in the array.

SUMMARY OF THE INVENTION

The present invention provides improved LED arrays that use vertical-emitting LEDs configured for high-voltage, low current driving conditions. These high-voltage vertical LED arrays generate substantially less heat than conventional LED arrays while having high brightness (high lumen output) and uniform emission characteristics. Further, the configuration of the inventive high-voltage vertical LED arrays is such that failure of one or more LEDs in the array does not disrupt the operation of other LEDs in the array.

In particular, the present invention provides an array of high-voltage vertical light-emitting diodes, each LED including a first electrode positioned on a light-emitting face and a second electrode. A conductive matrix surrounds each of the LEDs and electrically communicates with each of the electrodes. An electrically-insulating material is positioned between adjacent LEDs such that a first electrical current path is defined between the second and first electrodes through each LED. An isolating material penetrates the conductive matrix between adjacent second electrodes of each LED to isolate adjacent second electrodes from one another. Further positioned between adjacent LEDs is a material capable of permanently lowering its resistance to provide an alternate electrical pathway following a failure of an individual high-voltage vertical LED.

BRIEF DESCRIPTION OF THE DRAWINGS

FIGS. 1A-1B depict portions of high voltage vertical light emitting diode arrays according to embodiments of the present invention.

FIGS. 2A-2B depict the flow of current through a high voltage vertical light emitting diode array under normal conditions and following the failure of an LED in the array.

DETAILED DESCRIPTION

Figure 3B:
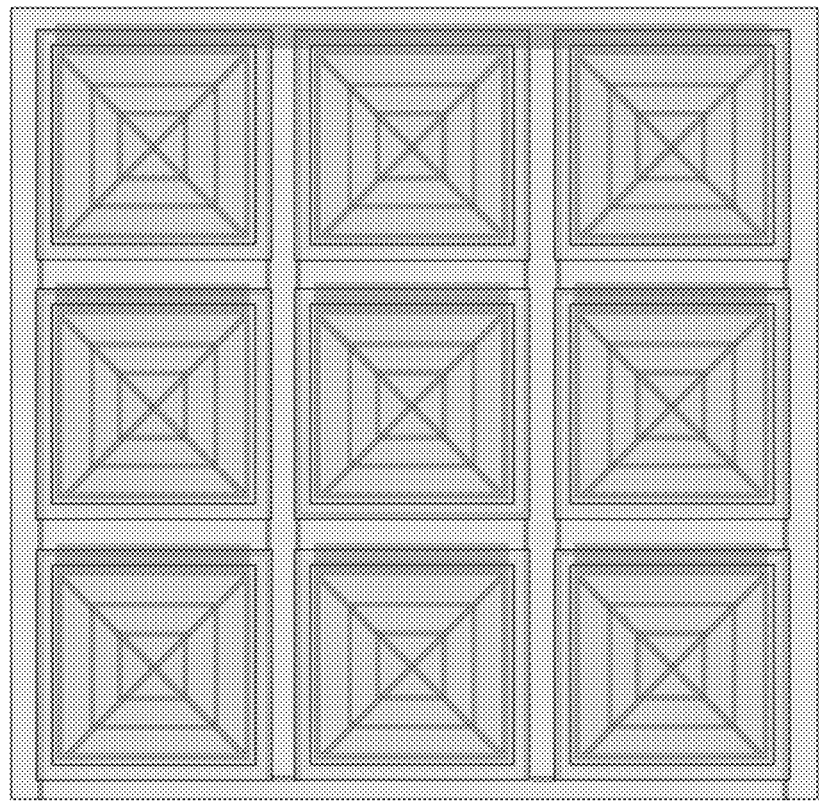
FIGS. 3A-3B depict arrays of LEDs connected in series (FIG. 3A) and parallel (FIG. 3B).

Turning to the drawings in detail, FIGS. 1A and 1B depict portions 100 of high voltage vertical light emitting diode arrays according to embodiments of the present invention. In FIG. 1A, two adjacent high voltage vertical light emitting diodes 200 are shown; however it is understood that the number of LEDs in any particular array can be selected according to the final application of the product (e.g., whether the array is to be used in a display or in a commercial lighting application, etc.). Thus an array can be a small or large number of LEDs, typically from as few as two LEDs to an array of 64 LEDs although these numbers are merely exemplary and not meant to be limiting; specifically, larger arrays of LEDs may also be fabricated according to the present invention.

Each LED 200 includes a first electrode 210 positioned on a light-emitting face 202 of LED 200 and a second electrode 220 positioned on another surface of the LED. The high voltage vertical LEDs used in the arrays of the present invention can be selected from any vertical LED materials and configurations; exemplary gallium nitride-based LEDs and their fabrication are disclosed in commonly-assigned U.S. Pat. No. 7,846,753, the disclosure of which is incorporated by reference herein. However, other vertical emitting LED materials and structures, including organic and inorganic material-based vertical LEDs may be used in the arrays of the present invention.

Electrode materials for electrodes 210 and 220 may be the same or different and can be selected from metals, alloys, conductive oxides, or other conductive materials. As electrodes 210 are positioned on a light-emitting face, transparent electrode materials such as indium tin oxide are optionally selected. Alternatively, thin metal electrodes can be used as electrodes 210. When various metal/metal alloy electrodes are sufficiently thin, the electrodes are sufficiently transparent/semi-transparent that light emitted from the LED is not substantially absorbed by the metal electrode. Such thin electrodes include gold, gold alloyed with palladium, platinum, nickel, nickel oxides, and palladium. Other materials can be used provided that they have high conductivity at a thickness sufficiently thin to be at least semi-transparent.

The LEDs 200 are surrounded by a conductive matrix 300. The conductive matrix electrically communicates with both the first electrode 210 and the second electrode 220 of each LED in the array and thus forms an electrode bridge between adjacent LEDs. By providing a large conductive matrix, better current spreading occurs in the array, helping to reduce inhomogeneous current distribution in a multiple quantum well structure of a vertical LED. To ensure a current path through each LED between electrodes 220 and 210, each LED includes an electrically insulating material 400 that prevents current from flowing through the conductive matrix between a pair of adjacent electrodes 220 under normal operating conditions. The conductive matrix is selected from conductive materials including metals, alloys, conductive polymers, or conductive inorganic materials or mixtures thereof. Copper and its alloys are exemplary conductive matrix materials since they possess both electrical conductivity and high thermal conductivity to assist with heat dissipation. The insulating material 400 is selected from inorganic or organic insulating material layers depending upon the selected fabrication technique, desired thickness, and dielectric constant of the insulating material. An exemplary insulating material is silicon dioxide. Other silicon-based materials including silicon nitride (stoichiometric or non-stoichiometric such as silicon-rich silicon nitride), SU-8, non-stoichiometric silicon oxide, and non-silicon based materials can be used. Optional dopants or material mixtures can also be used.

In FIG. 1B, an optional polishing stop material 350 is included within the conductive matrix for use during fabrication as explained in the commonly-assigned patent incorporated by reference above. The optional polishing stop is useful when chemical mechanical polishing is used for material removal. Alternative removal techniques include laser lift off, wet etching or other substrate material removal techniques used in device fabrication.

An electrical isolation layer 500 is positioned between the conductive matrix 300 and a substrate 600. In an exemplary embodiment, substrate 600 includes a silicon substrate 610 bonded by a metal layer 620 (for example, when substrate 600 is a substitute substrate from an original growth substrate such as sapphire). Further discussion of substitute substrates is found in the commonly-assigned patent.

Various isolation layer materials 500 can be selected such as oxide materials including, but not limited to, silicon oxides, aluminum oxides, titanium oxides, mixtures of oxides, nitrides, carbides, electrically-resistive polymeric materials such as SU-8, or any other material that provides suitable electrical isolation Electrical isolation layer 500 includes regions 510 that extend to the insulation layer 400, blocking the flow of current between a pair of adjacent electrodes 220. Regions 510 include a material, combination of materials, or multilayer material structure having electrical properties that are permanently altered following application of a predetermined current/voltage level to the material. Typically, the structure of the material or multilayer structure is altered following the application of a high voltage and/or current. For example, a resistive amorphous silicon material is converted/partially converted to conductive polysilicon, amorphous ("diamond-like) carbon is converted to conductive carbon, or silicon-rich silicon dioxide is converted to a conductive silicon material.

Note that the selection of the material(s) for region 510 is not critical. Any electrically resistive material, material combination, or multilayer structure that can be converted to create a conductive path through the application of a predetermined voltage/current can be selected for use in regions 510.

Various combinations of isolation material 500 and region 510 form exemplary embodiments of the present invention. In one embodiment, layer 500 is silicon oxide, while portions 510 include amorphous silicon/hydrogenated amorphous silicon. Alternatively, when layer 500 is silicon oxide, region 510 is silicon-rich silicon oxide. In either case, the layer 500 can optionally be integrally formed with portions 510 for example by CVD/PECVD of silane to form amorphous silicon, optionally mixed with oxygen to form silicon-rich silicon oxide while higher levels of oxygen are added such that the upper portions of layer 500 are silicon oxide. Since regions 510 are embedded at the wafer fabrication level, no external circuitry is required to create an alternative electrical path in the event of an individual LED failure, increasing the reliability and reducing the fabrication cost of the array.

In yet a further embodiment, isolation layer 500 and regions 510 are fabricated from the same material or combination of materials. However, upon failure of an LED, only portion 510 changes its resistance since only portion 510 is subjected to higher electrical voltage and/or current upon failure of an LED. An exemplary material for forming both region 500 and 510 is amorphous silicon. Following failure of an LED, the voltage is sufficient to "break down" the amorphous silicon forming polycrystalline silicon-metal alloy only in region 510 while region 500 remains amorphous silicon with a sufficiently high dielectric constant to provide electrical isolation. Note that the dielectric constant (and the resulting breakdown voltage) can be tailored through deposition conditions and the size and shape of region 510. Note that when other materials are selected as a combined 500/510 layer, the mechanism of resistance change for region 510 may be different than that for the amorphous silicon embodiment described above.

In normal operation, depicted in FIG. 2A, current flows from the conductive matrix 300 through each vertical LED 200 from electrode 220 to electrode 210 and then back to conductive matrix 300 from electrode 210 towards electrode 220 of an adjacent LED 200. In this manner the conductive matrix 300 acts as an electrode bridge between adjacent LEDs in the array. The LED array of FIG. 2A is shown wired in a series configuration between adjacent LEDs. This arrangement is shown in a top view in FIG. 3A. An alternative parallel wiring arrangement is shown in a top view in FIG. 3B.

Figure 3A:
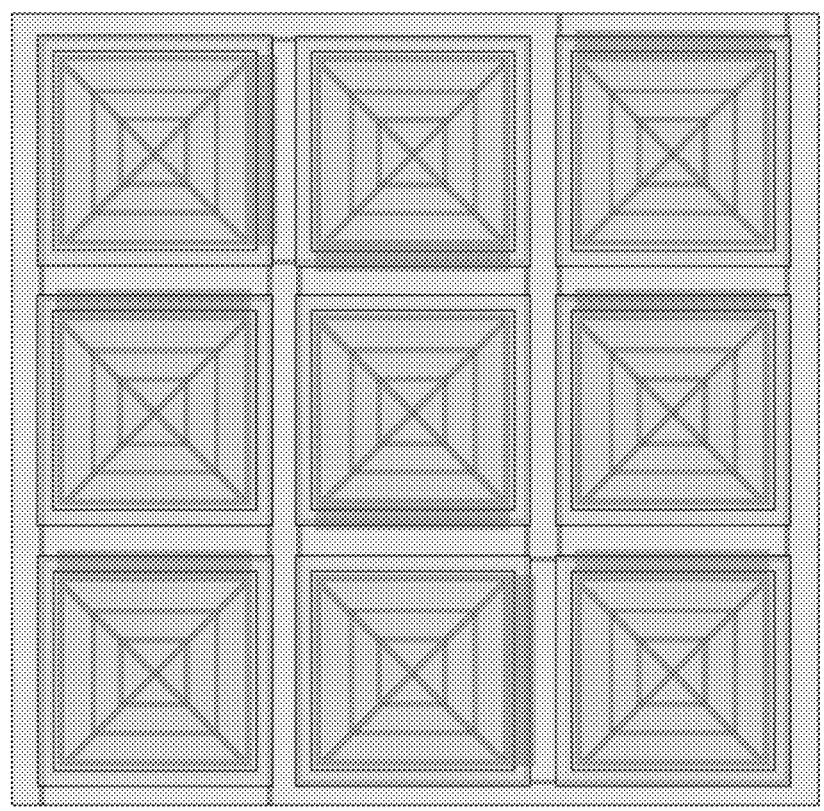

If an LED 200' fails as shown in FIG. 2B, current is unable to flow between electrodes 220 and 210 of LED 200' so the electrical path of the overall array is interrupted. This single LED failure would disrupt the entire array for a series-wired LED array (FIG. 3A). The high voltage experienced by region 510 under this condition changes the physical characteristics of the material. The material becomes sufficiently conductive to support a flow of current through region 510 and through the conductive matrix material 300 to reach the LED beyond failed LED 200'. Consequently, the overall array does not fail due to the failure of an individual LED (or even plural LEDs in the array), creating a fault-resistant LED array. Such tolerance to failed LEDs results in a higher overall manufacturing yield and resistance to electrostatic discharge damage and well as a more reliable device with a longer array lifetime.

Note that the material that changes electrical properties as the result of an applied voltage/current can be different at different positions within the array. That is, the electrical properties can be selectively tailored such that over-current is prevented in the event of a failure of multiple vertical LEDs in a single array. Alternatively, different materials can be embedded to be responsive to different levels of voltage/current or provide different levels of resistance to the same voltage/current levels as another material.

Other advantages provided by the arrays of the present invention include efficient and even current injection, better heat dissipation with lower junction temperature, lower ohmic loss with lower forward voltage, and higher light extraction with higher WPE (wall plug efficiency) and better LOP (light output power). Regarding fabrication, less wire bonding and simple packaging with smaller package design results from the arrays of the present invention. In use, the arrays of the present invention can be designed for use in circuits such that they do not require a dedicated circuit for AC/DC conversion saving on overall array cost.

While the invention has been described with respect to various exemplary features and advantages, it will be appreciated that the present invention is not limited to such features and that numerous other variations, alternatives, and modifications can be made without departed from the scope and spirit of the appended claims.

What is claimed is:

1. An array of high-voltage vertical light-emitting diodes comprising:
   a plurality of vertical light-emitting diodes, each vertical light emitting diode including a first electrode positioned on a light-emitting face of the vertical light-emitting diode and a second electrode positioned on a second surface of the vertical light-emitting diode;
   a conductive matrix surrounding each of the high-voltage vertical light emitting diodes and electrically communicating with each of the first electrodes and with each of the second electrodes of each of the high-voltage vertical light emitting diodes;
   an isolating material positioned in the conductive matrix between adjacent second electrodes of each of the high-voltage vertical light emitting diodes to isolate the adjacent second electrodes from one another such that a first electrical current path is defined between the second and first electrodes through each of the high voltage vertical light emitting diodes; and a resistance-changing material configured to permanently lower its resistance when subjected to a predetermined electrical voltage and/or current positioned between adjacent high-voltage vertical light emitting diodes for providing an alternate electrical pathway through the conductive matrix following a failure of an individual high-voltage vertical light emitting diode resulting in the application of the predetermined electrical voltage and/or current.

2. The array of high-voltage vertical light-emitting diodes as set forth in claim 1 wherein the conductive matrix comprises a metal or a metal alloy.

3. The array of high-voltage vertical light-emitting diodes as set forth in claim 1 wherein the first electrode is transparent or semi-transparent.

4. The array of high-voltage vertical light-emitting diodes as set forth in claim 3 wherein the first electrode includes a metal or metal alloy.

5. The array of high-voltage vertical light-emitting diodes as set forth in claim 3 wherein the first electrode includes a transparent oxide.

6. The array of high-voltage vertical light-emitting diodes as set forth in claim 1 wherein the light-emitting diodes are connected in series.

7. The array of high-voltage vertical light-emitting diodes as set forth in claim 2 wherein the conductive matrix comprises copper or a copper alloy.

8. The array of high voltage vertical light-emitting diodes as set forth in claim 1 wherein each of the high voltage vertical light-emitting diodes includes sidewall electrical insulation.

9. The array of high voltage vertical light-emitting diodes as set forth in claim 8 wherein the electrical isolation material extends in a layer along a surface of the conductive matrix.

10. The array of high voltage vertical light-emitting diodes as set forth in claim 9 wherein the electrical isolation layer includes protrusions extending within the conductive matrix toward an electrical insulation sidewall material on a high-voltage vertical light-emitting diode.

11. The array of high voltage vertical light-emitting diodes as set forth in claim 1 wherein the resistance-changing material is positioned within the protrusions of the electrical isolation layer.

12. The array of high voltage vertical light-emitting diodes as set forth in claim 1 wherein the resistance-changing material is a portion of the electrical isolation material and is the same composition as the electrical isolation material or is a substantially similar composition as the electrical isolation material prior to changing resistance.

13. The array of high voltage vertical light-emitting diodes as set forth in claim 1 wherein the resistance-changing material includes one or more of silicon oxide, silicon nitride, amorphous silicon, or amorphous carbon.

14. The array of high-voltage vertical light-emitting diodes as set forth in claim 1 wherein the isolation material is an oxide, nitride, electrically-resistive polymeric material or mixtures thereof.

15. The array of high voltage vertical light-emitting diodes as set forth in claim 11 wherein the isolation layer includes silicon oxide and the resistance-changing material includes silicon-rich silicon oxide.

16. The array of high voltage vertical light-emitting diodes as set forth in claim 11 wherein the isolation layer includes silicon oxide and the resistance-changing material includes amorphous silicon.

17. The array of high voltage vertical light-emitting diodes as set forth in claim 11 wherein the isolation layer includes SU-8 and the resistance-changing material includes silicon-rich silicon oxide.

18. The array of high voltage vertical light-emitting diodes as set forth in claim 11 wherein the isolation layer includes SU-8 and the resistance-changing material includes amorphous silicon.

19. The array of high-voltage vertical light-emitting diodes as set forth in claim 1 wherein the light-emitting diodes are connected in parallel.

20. The array of high-voltage vertical light-emitting diodes as set forth in claim 11 wherein the isolation material includes one or more of aluminum oxides, silicon oxides, SU-8, silicon nitrides, or mixtures thereof.

* * * * *